(12) United States Patent
Chang et al.

(10) Patent No.: US 9,799,668 B2
(45) Date of Patent: Oct. 24, 2017

(54) MEMORY CELL HAVING ISOLATED CHARGE SITES AND METHOD OF FABRICATING SAME

(71) Applicant: Intel Corporation, Santa Clara, CA (US)

(72) Inventors: Ting Chang, Hillsboro, OR (US); Chia-Hong Jan, Portland, OR (US); Walid M. Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/779,938

(22) PCT Filed: Jun. 25, 2013

(86) PCT No.: PCT/US2013/047622
§ 371 (c)(1),
(2) Date: Sep. 24, 2015

(87) PCT Pub. No.: WO2014/209284
PCT Pub. Date: Dec. 31, 2014

(65) Prior Publication Data
US 2016/0049418 A1 Feb. 18, 2016

(51) Int. Cl.
*H01L 27/115* (2017.01)
*H01L 27/11563* (2017.01)
(Continued)

(52) U.S. Cl.
CPC .... *H01L 27/11563* (2013.01); *G11C 16/0475* (2013.01); *H01L 21/28282* (2013.01);
(Continued)

(58) Field of Classification Search
CPC .......... G11C 16/0475; H01L 21/28282; H01L 29/42348; H01L 29/792; H01L 29/7923;
(Continued)

(56) References Cited

U.S. PATENT DOCUMENTS

| 2004/0232470 A1* | 11/2004 | Zheng ................ H01L 29/7923 257/311 |
| 2006/0035433 A1* | 2/2006 | Jung ................ H01L 21/28282 438/257 |
| 2006/0273377 A1 | 12/2006 | Chae et al. |

FOREIGN PATENT DOCUMENTS

| JP | 07-226449 | 8/1995 |
| JP | 09074102 | 3/1997 |

(Continued)

OTHER PUBLICATIONS

Office Action for Taiwanese Patent Application No. 103121560, dated Sep. 9, 2015, 5 pages.
(Continued)

*Primary Examiner* — Bo Fan
(74) *Attorney, Agent, or Firm* — Schwabe, Williamson & Wyatt P.C.

(57) ABSTRACT

Memory cells having isolated charge sites and methods of fabricating memory cells having isolated charge sites are described. In an example, a nonvolatile charge trap memory device includes a substrate having a channel region, a source region and a drain region. A gate stack is disposed above the substrate, over the channel region. The gate stack includes a tunnel dielectric layer disposed above the channel region, a first charge-trapping region and a second charge-trapping region. The regions are disposed above the tunnel dielectric layer and separated by a distance. The gate stack also includes an isolating dielectric layer disposed above the tunnel dielectric layer and between the first charge-trapping region and the second charge-trapping region. A gate dielectric layer is disposed above the first charge-trapping region, the second charge-trapping region and the isolating dielectric layer. A gate electrode is disposed above the gate dielectric layer.

20 Claims, 8 Drawing Sheets

(51) Int. Cl.
| | |
|---|---|
| *G11C 16/04* | (2006.01) |
| *H01L 21/28* | (2006.01) |
| *H01L 29/423* | (2006.01) |
| *H01L 29/66* | (2006.01) |
| *H01L 29/792* | (2006.01) |

(52) U.S. Cl.
CPC .... *H01L 29/4234* (2013.01); *H01L 29/42348* (2013.01); *H01L 29/66833* (2013.01); *H01L 29/792* (2013.01); *H01L 29/7923* (2013.01)

(58) Field of Classification Search
CPC ........... H01L 27/11563; H01L 29/4234; H01L 29/66833
USPC .......................................... 257/324; 438/287
See application file for complete search history.

(56) References Cited

FOREIGN PATENT DOCUMENTS

| | | |
|---|---|---|
| JP | 2001-168219 | 6/2001 |
| TW | 201023189 | 6/2010 |
| TW | 327372 | 7/2010 |

OTHER PUBLICATIONS

International Preliminary Report on Patentability for Application No. PCT/US2013/047622, dated Jan. 5, 2016, 10 pages.
"International Search Report and Written Opinion of the International Searching Authority dated Mar. 27, 2014, in International Patent Application No. PCT/US2013/047622".

* cited by examiner

MEMORY CELL HAVING ISOLATED CHARGE SITES AND METHOD OF FABRICATING SAME

CLAIM OF PRIORITY

This application is a U.S. National Phase application under 35 U.S.C. §371 of International Application No. PCT/US13/47622, filed Jun. 25, 2013, entitled "MEMORY CELL HAVING ISOLATED CHARGE SITES AND METHOD OF FABRICATING SAME," the entire contents of which are incorporated herein by reference.

TECHNICAL FIELD

Embodiments of the invention are in the field of semiconductor devices and processing and, in particular, memory cells having isolated charge sites and methods of fabricating memory cells having isolated charge sites.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. Furthermore, space constraint considerations may also impact efficiency with respect to the real estate of semiconductor die.

DESCRIPTION OF THE EMBODIMENTS

Figure 1:
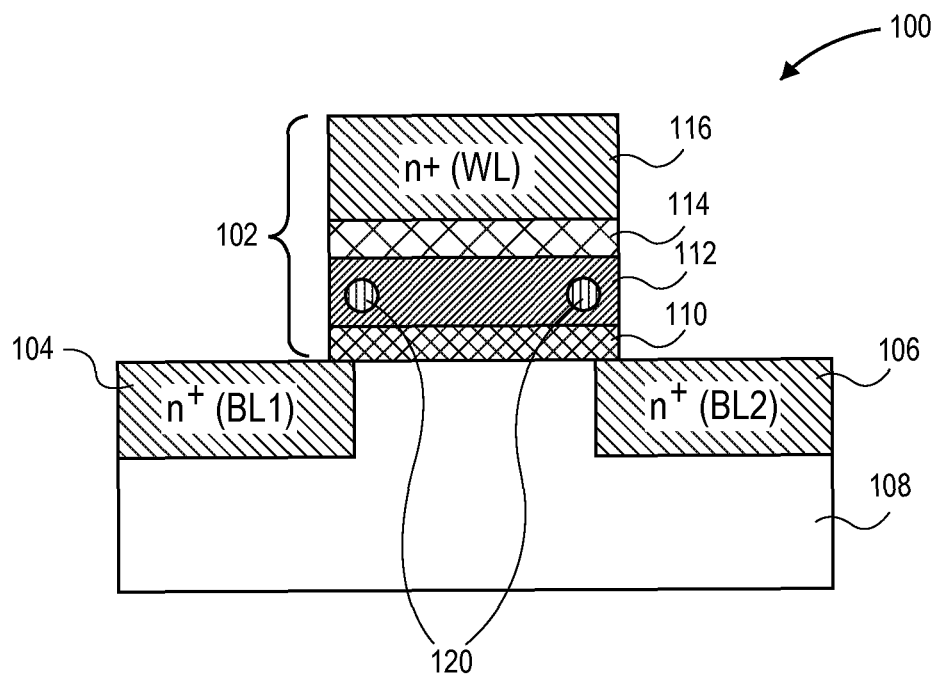
FIG. 1 illustrates a cross-sectional view of a conventional memory cell having electrically isolated charge-trapping locations, in accordance with the prior art.

Memory cells having isolated charge sites and methods of fabricating memory cells having isolated charge sites are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments described herein are directed to isolated structures for charge storage/trapping in flash memory cells. In an embodiment, memory cells described herein can be implemented as embedded memory for a system-on-chip (SoC) architecture, e.g., as embedded flash memory.

Generally, in an embodiment, isolated charge trapping/storing sites for non-volatile memory cells as described herein can be used to double a corresponding bit density of flash memory cells. Additionally, approaches described herein can be implemented to overcome scaling limits associated with conventional continuous charge trapping films (e.g., nitride films). Scaling limits associated with such continuous charge trapping layers may result from crosstalk and leakage issues between localized trapping sites which have typically been separated by a very short distance. Furthermore, embodiments described herein can enable fabrication compatibly with high-k and/or metal-gate processing along with flexibility in material selections for each layer/structure of the devices described.

More specifically, embodiments described herein are directed to the fabrication of trapping/storing sites that are not only electrically-isolated (e.g., as in continuous nitride films), but are also physically-isolated. Such physical isolation may enable elimination or at least mitigation of crosstalk between the two bits of a single memory cell, which can be favorable for scaling. In one embodiment, by physically separating the charge trapping/storing sites, a two-bit-per-cell flash device can readily be fabricated compatibly with high-k and/or metal-gate processes.

To provide context, conventional devices employ continuous nitride films for charge trapping in the continuous nitride films. The charge trapping is localized but the two trapping sites cannot be in close proximity, which can impede further scaling. By contrast, in accordance with an embodiment of the present invention, the physically isolated charge trapping/storing structures described herein can be integrated with CMOS processes without additional masks. Approaches described herein may further enable a broad selection in tunneling, trapping/storing, and gate materials where each figure of merit of the resulting device (e.g., program/erase/read voltage, program/erase/read speed, retention, endurance) can be tailored.

As will be elaborated and illustrated below in connection with the drawings, embodiments described herein can include one or more of the features: (1) the use of physical separation of trapping/storing sites for enhanced scaling and performance; (2) freedom in material selection for charge trapping/storing sites, tunnel/gate oxide, and gate material for improved performance (e.g., power, speed, retention, and endurance); (3) self-alignment with and compatibility with high-k and metal gate (HKMG) complimentary metal oxide semiconductor (CMOS) processes; and (4) work in combination with multi-level trapping/storing capability.

For comparison purposes, FIG. 1 illustrates a cross-sectional view of a conventional memory cell having electrically isolated charge-trapping locations, in accordance with the prior art. Referring to FIG. 1, an N-type semiconductor oxide nitride oxide semiconductor device 100 (SONOS NROM) includes a gate stack 102, a source region 104 and a drain region 106, as formed in and above a substrate 108. The source region 104 and drain region 106 are N-type regions that may be used as first (BL1) and second (BL2) bitlines, respectively. The gate stack 102 includes a tunnel dielectric layer 110, a charge-trapping layer 112, and a gate dielectric layer 114. The gate stack 102 also includes a gate electrode 116, e.g., an N-type gate electrode that can be used as a wordline (WL) for the device 100. The charge-trapping layer 112 is a non-conductive nitride film that traps charges at electrically-isolated locations 120. The charge-trapping layer 112 is a continuous material between the electrically-isolated locations 120.

Figure 2:
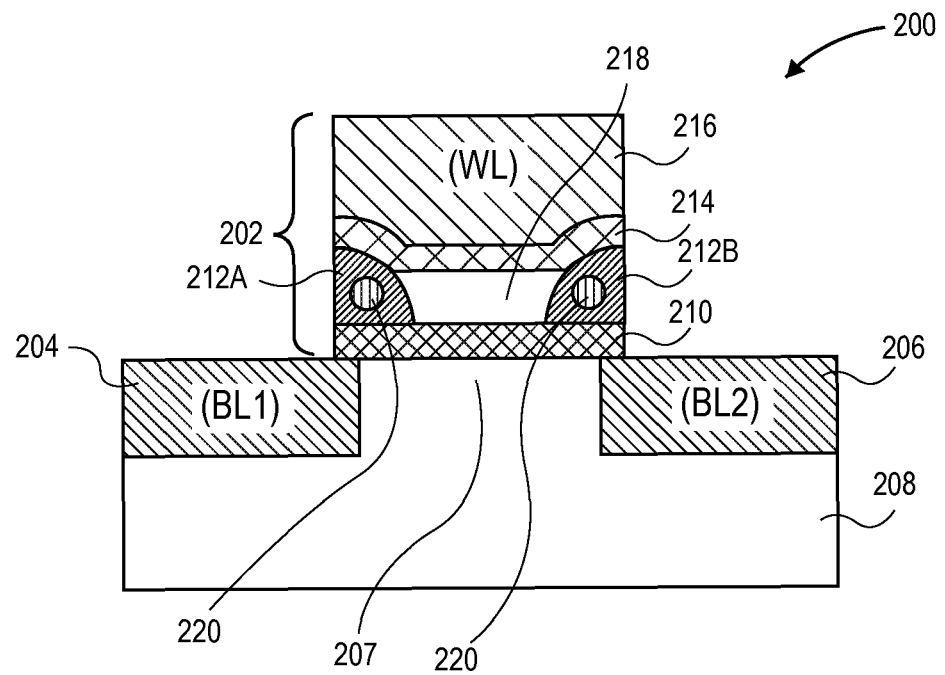
FIG. 2 illustrates a cross-sectional view of a memory cell having both physically and electrically isolated charge-trapping locations, in accordance with the present invention.

In contrast to FIG. 1, FIG. 2 illustrates a cross-sectional view of a memory cell having both physically and electrically isolated charge-trapping locations, in accordance with the present invention. Referring to FIG. 2, a semiconductor device 200 includes a gate stack 202, a source region 204 and a drain region 206, as formed in and above a substrate 208. The source region 204 and drain region 206 may be used as first (BL1) and second (BL2) bitlines, respectively. The gate stack 202 includes a tunnel dielectric layer 210, a charge-trapping layer 212 (shown as 212A and 212B), and a gate dielectric layer 214. A physically isolating dielectric layer 218 is vertically disposed between the tunnel dielectric layer 210 and the gate dielectric layer 214. The isolating dielectric layer 218 is horizontally disposed between the regions 212A and 212B of the charge-trapping layer 212. In embodiment, the charge-trapping layer 212 is a non-conductive dielectric film that traps charges at physically and electrically-isolated locations 220. As such, the charge-trapping layer 212 (shown as 212A and 212B) is not a continuous material between the electrically-isolated locations 220. In accordance with an embodiment of the present invention, the electrically-isolated locations 220 are self-aligned charge sites providing physically isolated structures for charge trapping and/or storing. The gate stack 202 also includes a gate electrode 216 that can be used as a wordline (WL) for the device 200. The gate electrode 216 is electrically isolated from the substrate 208.

Referring again to FIG. 2, in an embodiment, the device 200 can be viewed or described as a SONOS-type memory device. By convention, SONOS stands for "Semiconductor-Oxide-Nitride-Oxide-Semiconductor," where the first "Semiconductor" refers to the gate layer, the first "Oxide" refers to the gate dielectric layer, "Nitride" refers to the charge-trapping dielectric layer, the second "Oxide" refers to the tunnel dielectric layer and the second "Semiconductor" refers to the channel region material. A SONOS-type device, however, is not limited to these specific materials, as described below. In one embodiment, the SONOS device is an N-type SONOS device (SONOS NROM). In another embodiment, the SONOS device is a P-type SONOS device (SONOS PROM). In an embodiment, devices that include a metal gate electrode may be referred to as MONOS devices.

Referring again to FIG. 2, in an embodiment, substrate 208 may be composed of a material suitable for semiconductor device fabrication. In one embodiment, substrate 208 is a bulk substrate composed of a single crystal of a material which may include, but is not limited to, silicon, germanium, silicon-germanium or a III-V compound semiconductor material. In another embodiment, substrate 208 includes a bulk layer with a top epitaxial layer. In a specific embodiment, the bulk layer is composed of a single crystal of a material which may include, but is not limited to, silicon, germanium, silicon-germanium, a III-V compound semiconductor material or quartz, while the top epitaxial layer is composed of a single crystal layer which may include, but is not limited to, silicon, germanium, silicon-germanium or a III-V compound semiconductor material. In another embodiment, substrate 208 includes a top epitaxial layer on a middle insulator layer which is above a lower bulk layer. The top epitaxial layer is composed of a single crystal layer which may include, but is not limited to, silicon (i.e. to form a silicon-on-insulator (SOI) semiconductor substrate), germanium, silicon-germanium or a III-V compound semiconductor material. The insulator layer is composed of a material which may include, but is not limited to, silicon dioxide, silicon nitride or silicon oxy-nitride. The lower bulk layer is composed of a single crystal which may include, but is not limited to, silicon, germanium, silicon-germanium, a III-V compound semiconductor material or quartz. Substrate 208 may include dopant impurity atoms. In a specific embodiment, at least a portion of substrate 208 is doped P-type and, in an alternative embodiment, at least a portion of substrate 208 is doped N-type.

Referring again to FIG. 2, in an embodiment, source region 204 and drain region 206 are formed in substrate 208 and may be regions having opposite conductivity to the respective portion of substrate 208 (e.g., opposite to a channel region 207 formed in substrate 208. For example, in one embodiment, source and drain regions 204 and 206 are N-type doped regions while channel region 207 is a P-type doped region. In one embodiment, substrate 208 and, hence, channel region 207 is composed of boron-doped single-crystal silicon having a boron concentration approximately in the range of $1 \times 10^{15}$-$1 \times 10^{19}$ atoms/cm$^3$. Source and drain regions 204 and 206 are composed of phosphorous- or arsenic-doped regions having a concentration of N-type dopants approximately in the range of $5 \times 10^{16}$-$5 \times 10^{19}$ atoms/cm$^3$. In an alternative embodiment, source and drain regions 204 and 206 are P-type doped regions while channel region 207 is an N-type doped region.

Referring again to FIG. 2, in an embodiment, tunnel dielectric layer 210 may be composed of a material and have a thickness suitable to allow charge carriers to tunnel into the charge-trapping layer under an applied gate bias, while maintaining a suitable barrier to leakage when the device is unbiased. In one embodiment, tunnel dielectric layer 210 is formed by a thermal oxidation process and is composed of silicon dioxide or silicon oxy-nitride, or a combination thereof. In another embodiment, tunnel dielectric layer 210 is formed by chemical vapor deposition or atomic layer deposition and is composed of a dielectric layer which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. In another embodiment, tunnel dielectric layer 210 is a bi-layer dielectric region including a bottom layer of a material such as, but not limited to, silicon dioxide or silicon oxy-nitride and a top layer of a material which may include, but is not limited to, silicon nitride, aluminum oxide, hafnium oxide, zirconium oxide, hafnium silicate, zirconium silicate, hafnium oxy-nitride, hafnium zirconium oxide or lanthanum oxide. Thus, in one embodiment, tunnel dielectric layer 210 includes a high-K dielectric portion. In a specific embodiment, tunnel dielectric layer 210 has a thickness approximately in the range of 1-10 nanometers.

Referring again to FIG. 2, in an embodiment, charge-trapping layer 212 (e.g., as regions 212A and 212B) may be composed of a material and have a thickness suitable to store charge and, hence, raise the threshold voltage of gate stack 202. In one embodiment, charge-trapping layer 212 is formed by a chemical vapor deposition process and is composed of a dielectric material which may include, but is not limited to, stoichiometric silicon nitride, silicon-rich silicon nitride or silicon oxy-nitride. In one embodiment, the charge-trapping layer 212 has a thickness approximately in the range of 5-10 nanometers.

Referring again to FIG. 2, in an embodiment, the physically isolating dielectric layer 218 may be composed of a material and have a thickness suitable to isolate regions 212A and 212B of charge-trapping layer 212 to avoid cross-talk between the two regions. In one embodiment, the physically isolating dielectric layer 218 is formed by a chemical vapor deposition process and is composed of a dielectric material such as, but not limited to, silicon oxide ($SiO_x$) or stoichiometric silicon dioxide ($SiO_2$). In an alternative embodiment, a low-k dielectric material (e.g., a material having a dielectric constant below 4) is used to form the physically isolating dielectric layer 218. In an embodiment, the physically isolating dielectric layer 218 has a thickness approximately the same as the thickness of the charge-trapping layer 212. However, in an alternative embodiment, the physically isolating dielectric layer 218 has a thickness less than the thickness of the charge-trapping layer 212. In yet another embodiment, the physically isolating dielectric layer 218 has a thickness greater than the thickness of the charge-trapping layer 212. In an embodiment, the width of the physically isolating dielectric layer 218 (e.g., the distance between regions 212A and 212B of charge-trapping layer 212) is approximately in the range of 3-20 nanometers. It is to be understood that the lower end of the range represents a minimum of a few nanometers, while the upper limit may depend upon eventual gate length used.

Referring again to FIG. 2, in an embodiment, the gate dielectric layer 214 may be composed of a material and have a thickness suitable to maintain a barrier to charge leakage without significantly decreasing the capacitance of gate stack 202. In one embodiment, the gate dielectric layer 214 is formed by a chemical vapor deposition process. In a specific such embodiment, the gate dielectric layer 214 is composed of silicon dioxide, silicon oxy-nitride, silicon nitride, or a combination thereof. In another embodiment, the gate dielectric layer 214 is formed by atomic layer deposition. In a specific such embodiment, the gate dielectric layer 214 is composed of a high-k dielectric layer which may include, but is not limited to, hafnium oxide, zirconium oxide, hafnium silicate, hafnium oxy-nitride, hafnium zirconium oxide or lanthanum oxide. In a specific embodiment, the gate dielectric layer 214 has a thickness approximately in the range of 1-20 nanometers.

Referring again to FIG. 2, in an embodiment, the gate electrode 216 may be composed of a conductor or semiconductor material suitable for accommodating a bias during operation of a SONOS-type transistor. In one embodiment, the gate electrode 216 is formed by a chemical vapor deposition process. In a specific such embodiment, the gate electrode 216 is composed of doped poly-crystalline silicon. In another embodiment, the gate electrode 216 is formed by physical vapor deposition and is composed of a metal-containing material which may include, but is not limited to, metal nitrides, metal carbides, metal silicides, hafnium, zirconium, titanium, tantalum, aluminum, ruthenium, palladium, platinum, cobalt or nickel. In one embodiment, the gate electrode 216 has an N-type work-function. In an alternative embodiment, the gate electrode 216 has a P-type work-function.

Figure 3A:
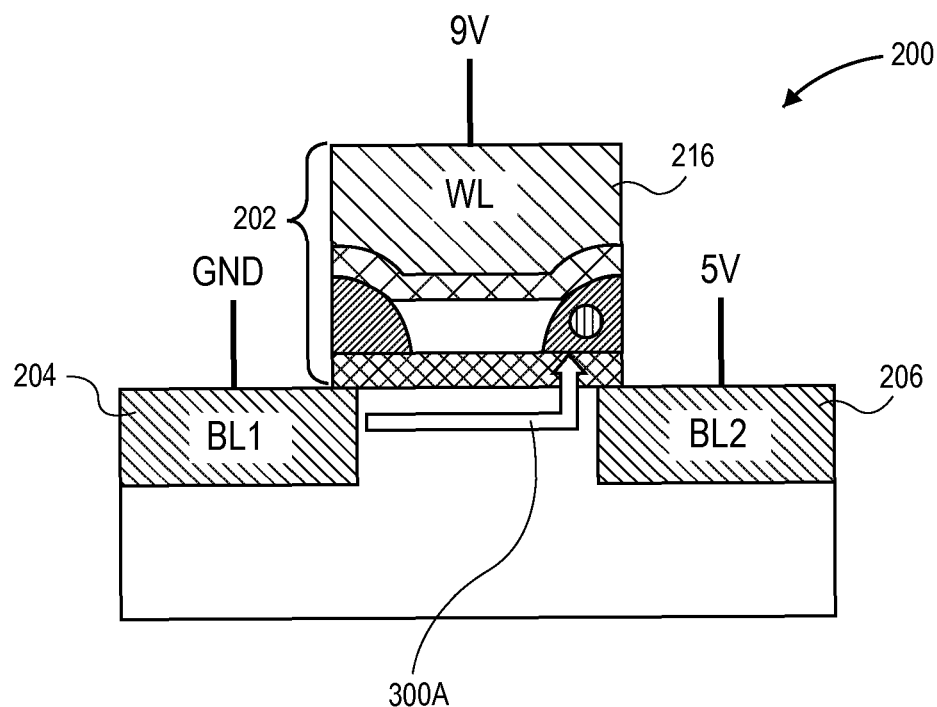
FIG. 3A illustrates a cross-sectional view of a memory cell of FIG. 2 having both physically and electrically isolated charge-trapping locations and operated in a program mode, in accordance with an embodiment of the present invention.
Figure 3B:
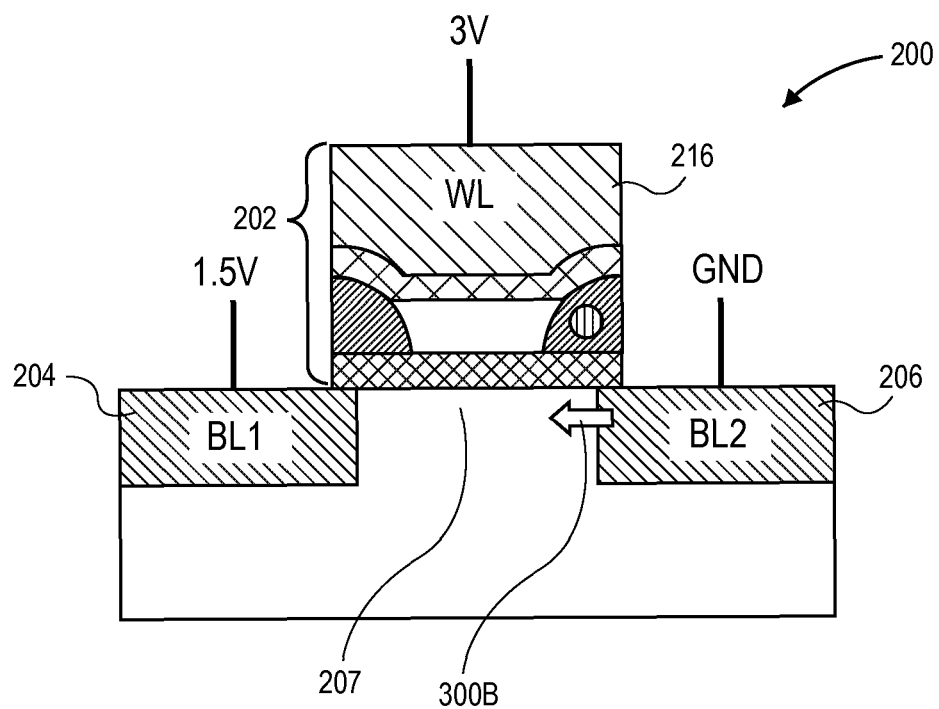
FIG. 3B illustrates a cross-sectional view of a memory cell of FIG. 2 having both physically and electrically isolated charge-trapping locations and operated in a read mode, in accordance with an embodiment of the present invention.
Figure 3C:
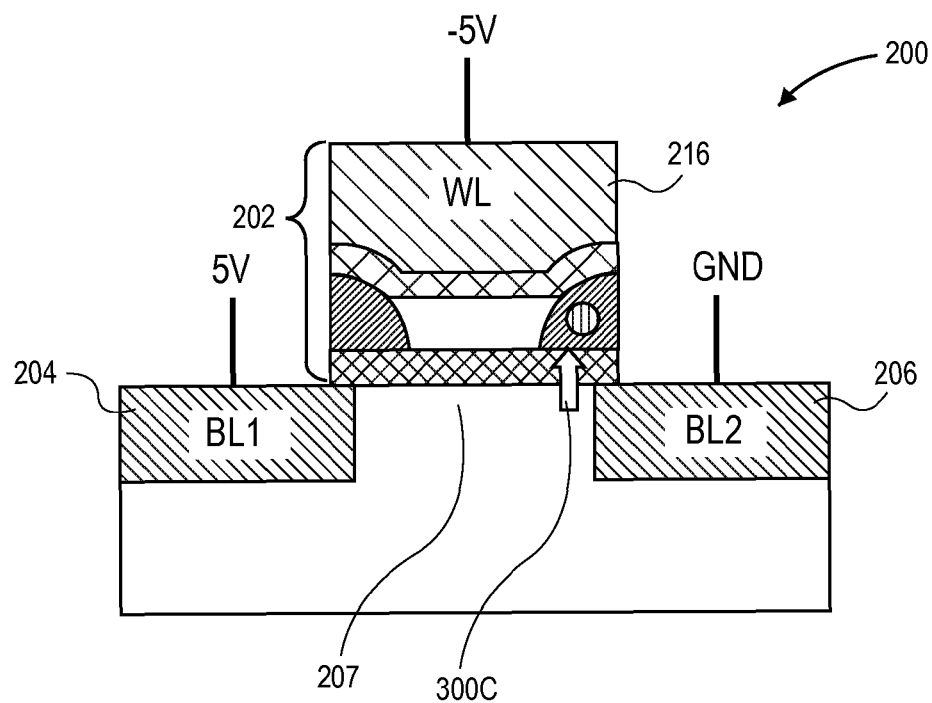
FIG. 3C illustrates a cross-sectional view of a memory cell of FIG. 2 having both physically and electrically isolated charge-trapping locations and operated in an erase mode, in accordance with an embodiment of the present invention.

The device described in association with FIG. 2 may be operated as a non-volatile memory device. FIGS. 3A-3C illustrate cross-sectional view of a memory cell of FIG. 2 having both physically and electrically isolated charge-trapping locations and operated in a program mode (FIG. 3A), a read mode (FIG. 3B) and an erase mode (FIG. 3C), in accordance with an embodiment of the present invention. It is to be understood that for operations for the mirrored bit, the BL1 and BL2 voltages described below are flipped.

Referring to FIG. 3A, programming of device 200 involves channel hot carrier injection. In an exemplary embodiment, a 9V bias is applied to the gate electrode 216 of gate stack 202. The source region 204 (BL1) is connected to ground (GND). Finally, the drain region 206 (BL2) is biased with a 5V bias. A pathway 300A of charge carriers (e.g., electrons) is from the source region 204 (BL1) to region 212B of charge-trapping layer 212. The resulting electric field between the gate and the substrate causes electrons to tunnel from the substrate through the thin tunnel oxide layer where they are trapped in the charge-trapping layer. When the programming voltage is removed, the electrons that are trapped in the nitride layer repel electrons from the channel and induce a positive space charge in the P-type channel. The electron depleted channel forms P-N junctions with the N+ source and drain diffusions. In such a state, the transistor may not conduct current from drain to source in the presence of an applied drain-to-source voltage. The programmed state may be associated with a logic state (e.g., a logical "1").

Referring to FIG. 3B, reading of device 200 involves a reverse mode to enhance a read window. In an exemplary embodiment, a 3V bias is applied to the gate electrode 216 of gate stack 202. The drain region 206 (BL2) is connected to ground (GND). Finally, the source region 204 (BL2) is biased with a 1.5V bias. A pathway 300B of charge carriers (e.g., electrons) is provided from the drain region 206 (BL2) to the channel region 207 of device 200. In one embodiment, greater sensitivity is achieved with trapped electrons near the source region 204 than near the drain region 206. It is to be understood that, in an embodiment, greater sensitivity is achieved when the trapped electrons are near the "source" of electrons in the channel, in this case 206.

Referring to FIG. 3C, erasing of device 200 involves band-to-band hot-hole tunneling. In an exemplary embodiment, a −5V bias is applied to the gate electrode 216 of gate stack 202. The source region 204 (BL1) is biased with a 5V. Finally, the drain region 206 (BL2) is bias connected to ground (GND, 0V). A pathway 300C of charge carriers (e.g., holes) is from the channel region 207 to region 212B of charge-trapping layer 212. The resulting electric field between the gate and the substrate causes holes to tunnel from the substrate through the thin tunnel oxide layer where they are trapped in the charge-trapping layer. When the erase voltage is removed, the holes that are trapped in the nitride layer attract electrons to the channel, which inverts the normally P-type channel. The inverted channel then allows the transistor to conduct current between the drain and source in the presence of an applied voltage.

In another aspect, a device such as device 200 from FIG. 2 may be formed by using a replacement gate or damascene type process. As an example, FIGS. 4A-4D illustrate cross-sectional views of various operations in a method of fabricating a memory cell having both physically and electrically isolated charge-trapping locations, in accordance with the present invention.

Figure 4A:
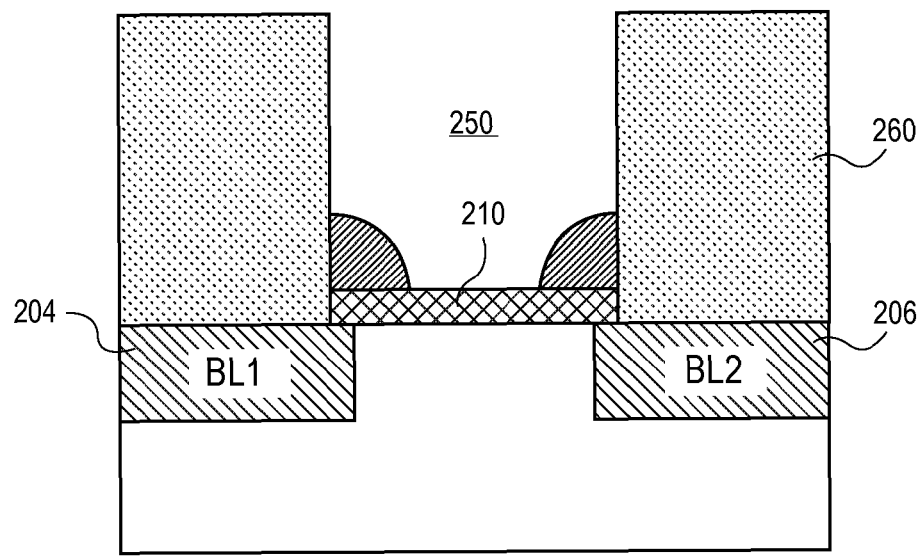
FIGS. 4A-4D illustrate cross-sectional views of various operations in a method of fabricating a memory cell having both physically and electrically isolated charge-trapping locations, in accordance with the present invention.

Referring to FIG. 4A, a trench 250 is formed in an inter-layer dielectric layer 260. In one embodiment, the trench 250 is formed in a replacement gate processing scheme (described in greater detail below), leaving source and drain regions 204 and 206, respectively, self-aligned with the trench 250. The tunnel dielectric layer 210 is then formed in the trench 250. Regions 212A and 212B of the charge-trapping layer are then formed in the trench 250, on tunnel dielectric layer 210. In one embodiment, the regions 212A and 212B of the charge-trapping layer are formed by deposition and etching (e.g., in a spacer-forming approach) of the charge-trapping material.

Figure 4B:
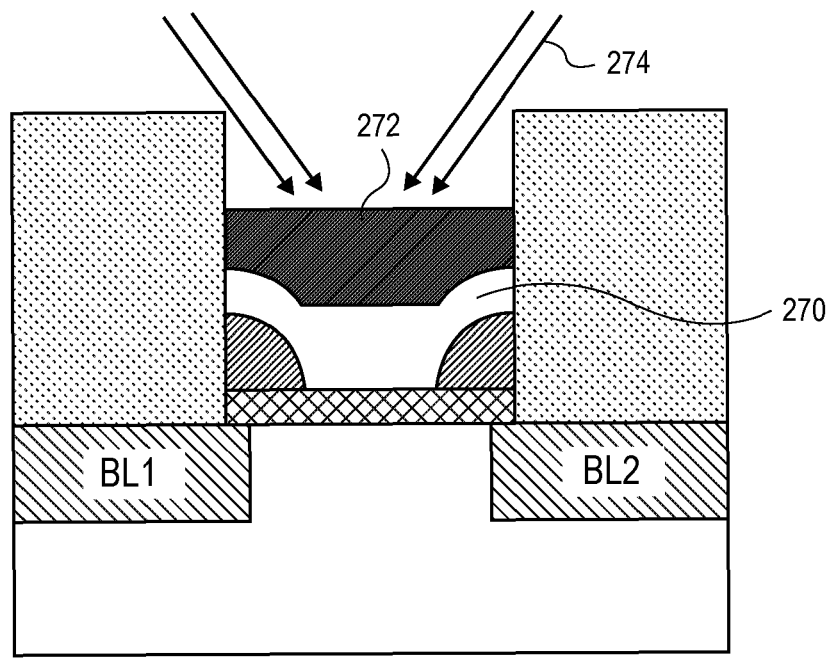

Referring to FIG. 4B, a material layer 270 precursor to the isolating dielectric layer 218 is formed by deposition in the remaining portions of trench 250 of FIG. 4A, and on the tunnel dielectric layer 210 and regions 212A and 212B of the charge-trapping layer. A spin-on dielectric layer, such as a bottom anti-reflective coating layer 272 (BARC layer) is then formed on the material layer 270 precursor to the isolating dielectric layer 218. An angled implant process 274 is then performed in order to harden regions of the spin-on dielectric layer 270 near the center of the layer.

Figure 4C:
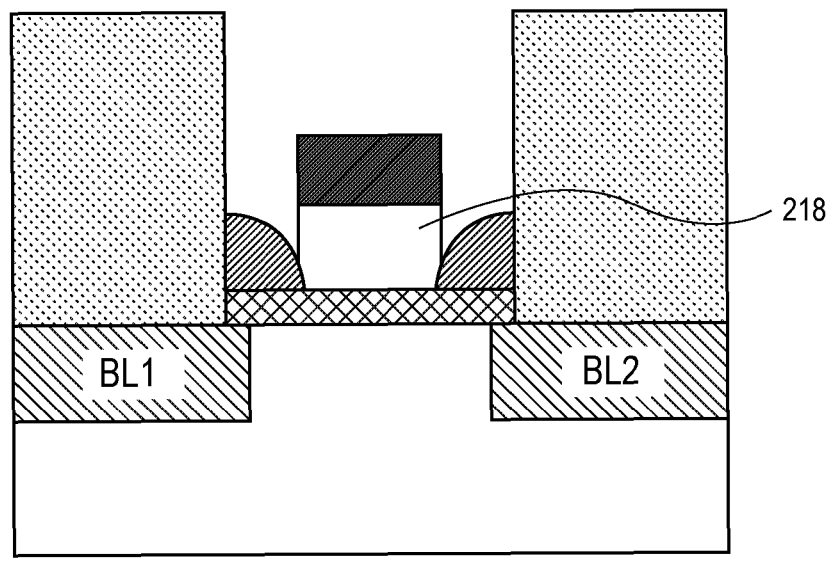

Referring to FIG. 4C, the edges of the spin-on dielectric layer 270 (e.g., the non-hardened portions) and the material layer 270 are removed by an etch process to leave the patterned isolating dielectric layer 218 to remain Portions of the spin-on dielectric layer 270 (e.g., the hardened portions) also remain, as depicted in FIG. 4C.

Figure 4D:
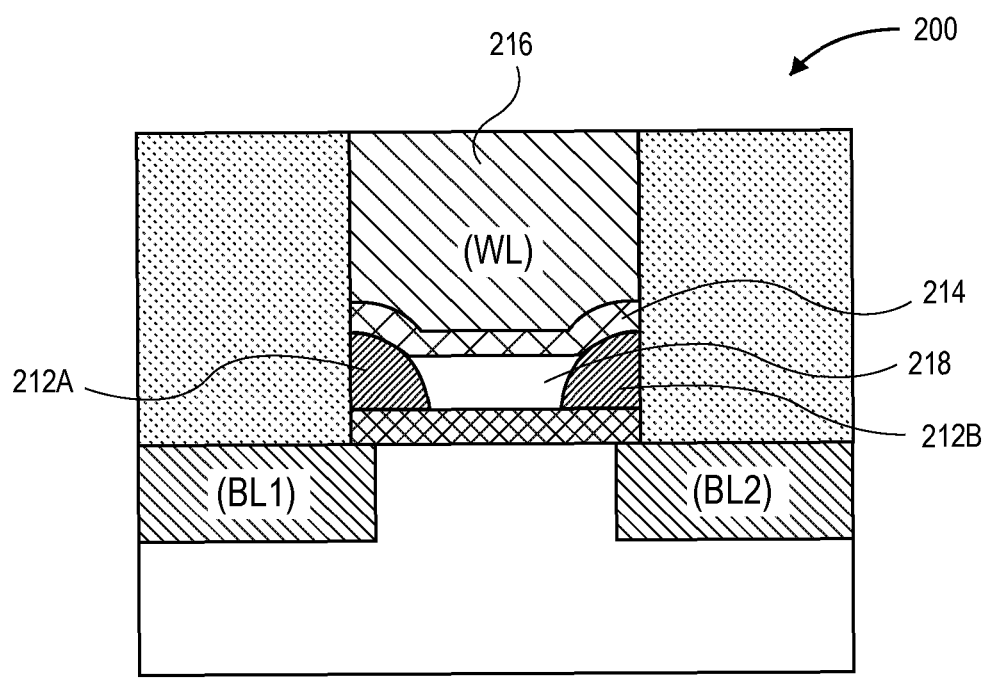

Referring to FIG. 4D, the portions of the spin-on dielectric layer 270 that remain are removed, e.g., by a dry or wet etch process. The gate dielectric layer 214 is then formed on the isolating dielectric layer 218 and on exposed portions of the charge-trapping layer (e.g., shown as regions 212A and 212B). The gate electrode 216 is then deposited to complete filling of the trench 250. It is to be understood that a chemical mechanical planarization (CMP) operations may be used to confine the above described materials to the trench 250. It is also to be understood that subsequent processing, such as back end dielectric and metallization processing may be used to form an integrated circuit based on a plurality of devices such as device 200 of FIG. 4D.

As another example, FIGS. 5A-5D illustrate cross-sectional views of various operations in a method of fabricating a memory cell having both physically and electrically isolated charge-trapping locations, in accordance with the present invention.

Figure 5A:
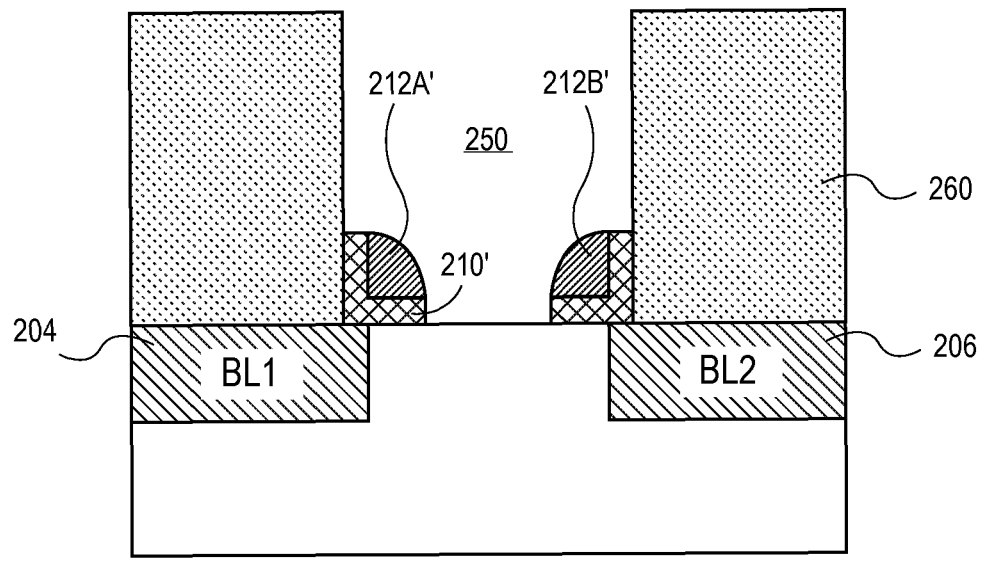
FIGS. 5A-5D illustrate cross-sectional views of various operations in another method of fabricating a memory cell having both physically and electrically isolated charge-trapping locations, in accordance with the present invention.

Referring to FIG. 5A, a trench 250 is formed in an inter-layer dielectric layer 260. In one embodiment, the trench 250 is formed in a replacement gate processing scheme (described in greater detail below), leaving source and drain regions 204 and 206, respectively, self-aligned with the trench 250. A tunnel dielectric layer 210' is then formed in the trench 250. Regions 212A' and 212B' of a charge-trapping layer are then formed in the trench 250, on tunnel dielectric layer 210'. In one embodiment, the tunnel dielectric layer 210' and the regions 212A' and 212B' of the charge-trapping layer are formed by deposition and etching (e.g., in a spacer-forming approach), providing the tunnel dielectric layer 210' below and along the sidewalls of the regions 212A' and 212B' of the charge-trapping layer. In one embodiment, the portion of the tunnel dielectric layer 210' between the regions 212A' and 212B' of the charge-trapping layer is also removed, as depicted in FIG. 5A.

Figure 5B:
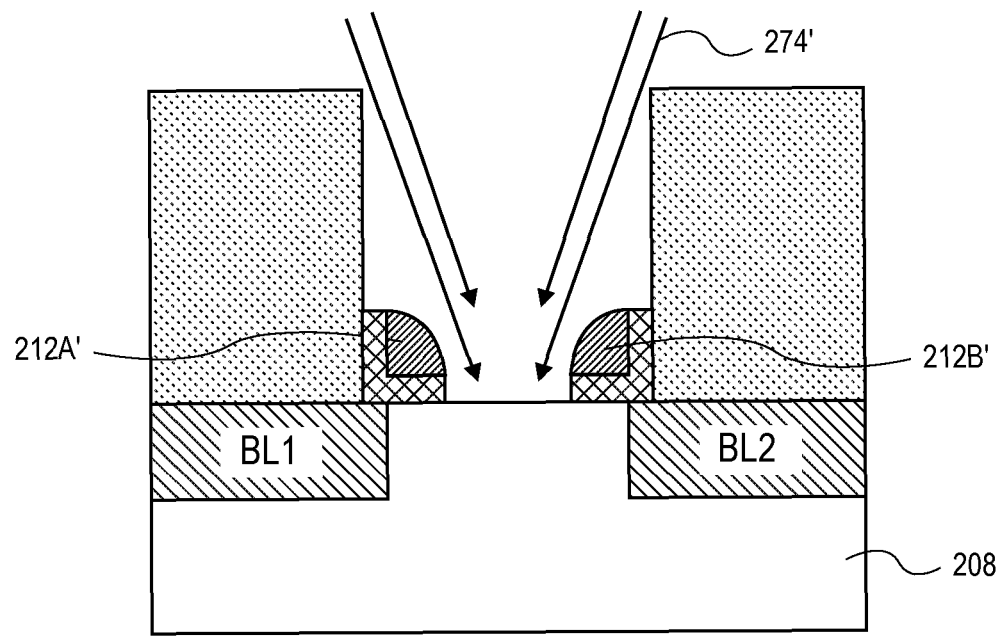

Referring to FIG. 5B, an angled implant process 274' is optionally used to damage the exposed portion of the substrate 208 between the regions 212A' and 212B' of the charge-trapping layer. In one embodiment, the angled implant process 274' is used to damage exposed silicon from a bulk silicon substrate.

Figure 5C:
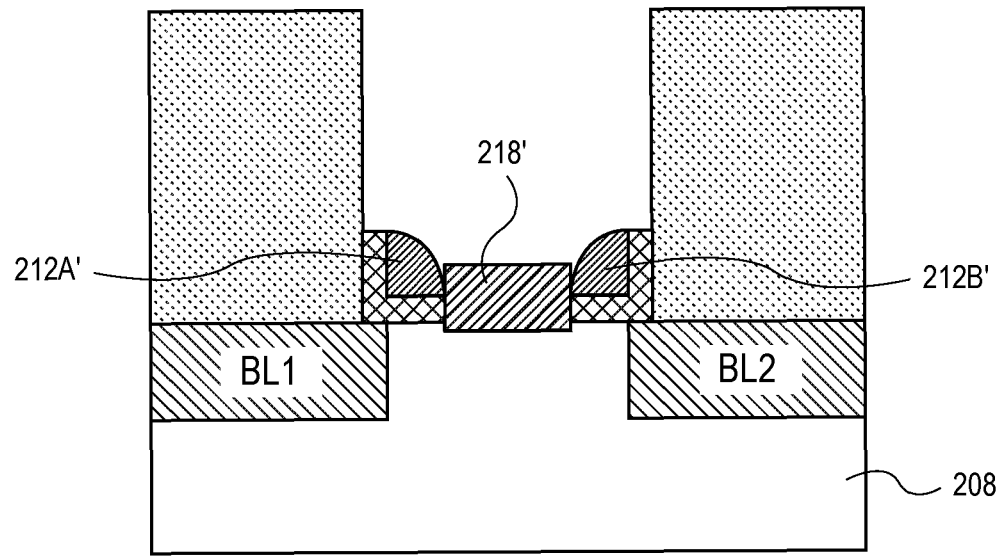

Referring to FIG. 5C, the damaged portion of the substrate 208 between the regions 212A' and 212B' is oxidized to form an isolating dielectric layer 218'. In one embodiment, a damaged portion of a silicon substrate is oxidized to form a silicon oxide or silicon dioxide isolating dielectric layer 218'.

Figure 5D:
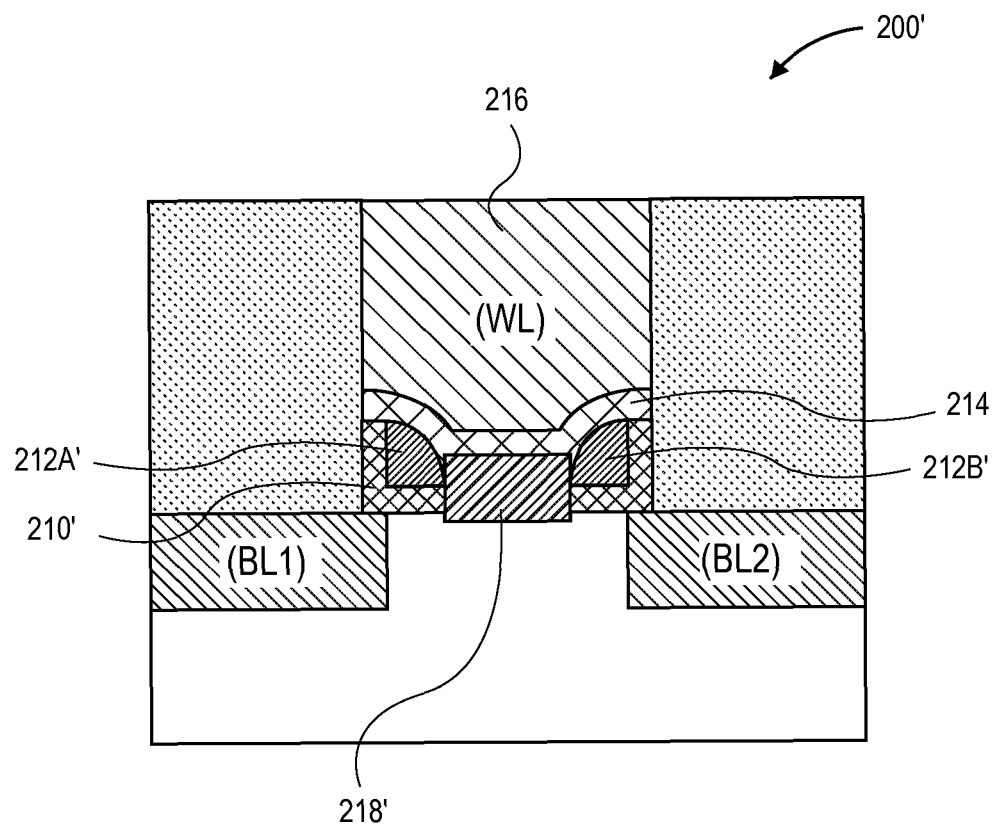

Referring to FIG. 5D, the gate dielectric layer 214 is then formed on the isolating dielectric layer 218' and on exposed portions of the charge-trapping layer (e.g., shown as regions 212A' and 212B') and on exposed portions of the tunnel dielectric layer 210' (e.g., the exposed sidewall portions). The gate electrode 216 is then deposited to complete filling of the trench 250. It is to be understood that a chemical mechanical planarization (CMP) operations may be used to confine the above described materials to the trench 250. It is also to be understood that subsequent processing, such as back end dielectric and metallization processing may be used to form an integrated circuit based on a plurality of devices such as device 200' of FIG. 5D.

Referring again to FIGS. 4A and 5B, a replacement gate process may be used to provide the starting structures for final device fabrication. In such a scheme, dummy gate material such as polysilicon or silicon nitride pillar material, may be removed such that replacement with the final (permanent) materials of device 200. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid. In an embodiment a dummy dielectric layer is also included (e.g., a silicon dioxide layer) and is removed for replacement with a tunneling dielectric layer, e.g., by treatment with aqueous or vapor hydrofluoric acid (HF).

Thus, overall, in an embodiment, flash memory cells using localized trapping with electrical and physical separation between trap sites has been described. By appropriated biasing of the terminals of such a device, charge trapping/storing can take place near the edges of the trapping/storing film. Embodiments may enable enhancement of bit cell density versus that of traditional flash cells by using high-k and metal-gate processes at downscaled generation nodes. Embodiments may allow for flexibility in tunneling, trapping/storing, and gate material selections for tuning of, e.g., program/erase/read voltage, speed, retention, and endurance.

Embodiments described herein may be applicable to designs requiring flash memory embedded in a multi-functional chip, e.g., embedded in a system-on-chip (SoC) product. Current flash memory cells may not be scalable to smaller design sizes. By contrast, in an embodiment, flash memory cells having isolated charge sites as described herein enable a smaller device and, hence, circuit design and footprint.

Figure 6:
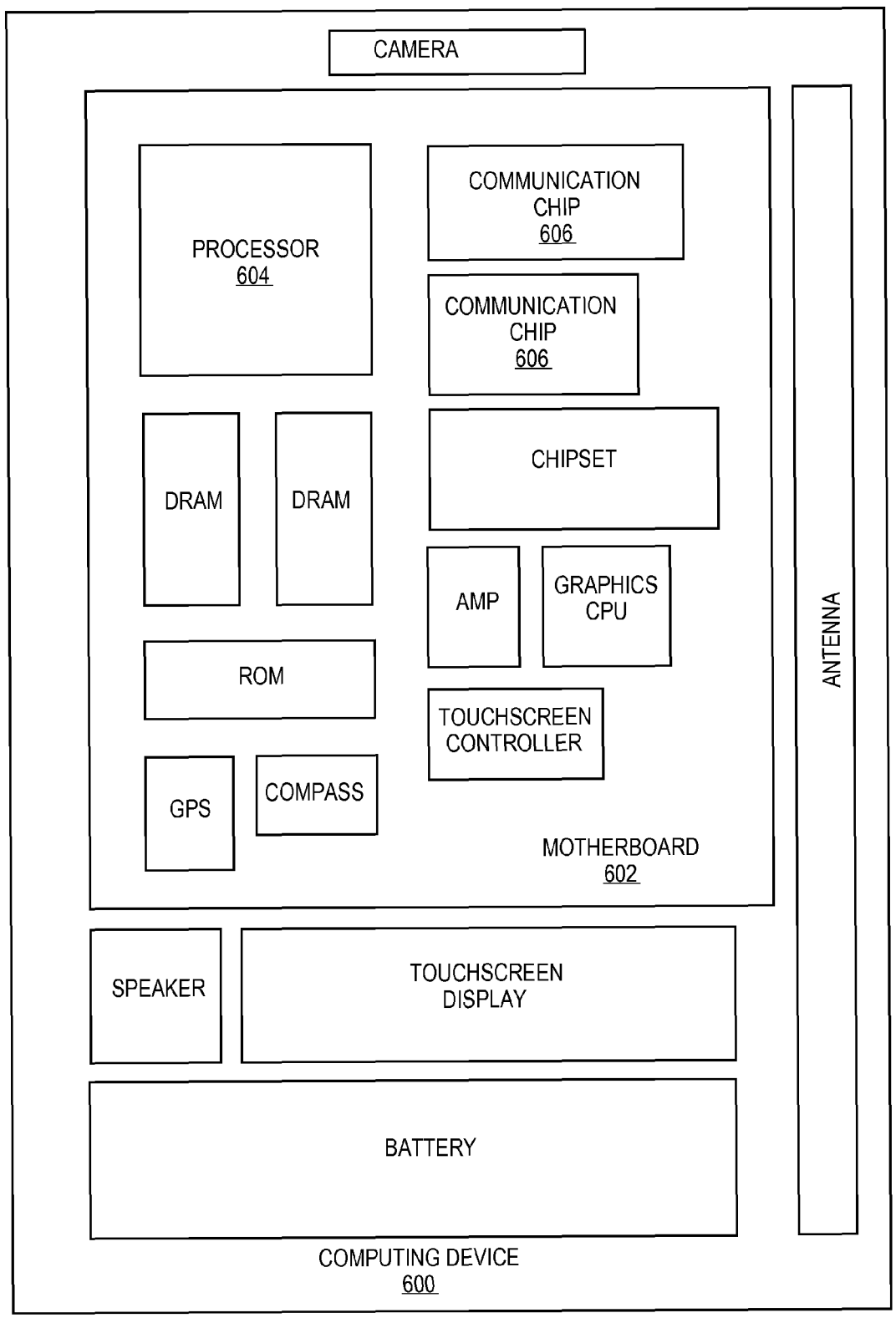
FIG. 6 illustrates a computing device in accordance with one implementation of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as memory cells having isolated charge sites built in accordance with implementations of the invention, e.g., as a portion of a system-on-chip (SoC) architecture. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as memory cells having isolated charge sites built in accordance with implementations of the invention, e.g., as a portion of a system-on-chip (SoC) architecture.

In further implementations, another component housed within the computing device 600 may contain an integrated circuit die that includes one or more devices, such as memory cells having isolated charge sites built in accordance with implementations of the invention, e.g., as a portion of a system-on-chip (SoC) architecture.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Thus, embodiments of the present invention include memory cells having isolated charge sites and methods of fabricating memory cells having isolated charge sites.

In an embodiment, a nonvolatile charge trap memory device includes a substrate having a channel region, a source region and a drain region. A gate stack is disposed above the substrate, over the channel region. The gate stack includes a tunnel dielectric layer disposed above the channel region, a first charge-trapping region and a second charge-trapping region. The regions are disposed above the tunnel dielectric layer and separated by a distance. The gate stack also includes an isolating dielectric layer disposed above the tunnel dielectric layer and between the first charge-trapping region and the second charge-trapping region. A gate dielectric layer is disposed above the first charge-trapping region, the second charge-trapping region and the isolating dielectric layer. A gate electrode is disposed above the gate dielectric layer.

In one embodiment, the isolating dielectric layer both physically and electrically isolates the first charge-trapping region from the second charge-trapping region.

In one embodiment, the distance between the first charge-trapping region and the second charge-trapping region is approximately in the range of 3-20 nanometers.

In one embodiment, the isolating dielectric layer is composed of silicon oxide or silicon dioxide.

In one embodiment, the gate dielectric layer is composed of a high-k dielectric material.

In one embodiment, the gate electrode is a metal gate electrode.

In one embodiment, the nonvolatile charge trap memory device is a SONOS-type device.

In one embodiment, the source region, the drain region and the gate electrode are N-type, and the SONOS-type device is an N-type SONOS-type device.

In an embodiment, a nonvolatile charge trap memory device includes a substrate having a channel region, a source region and a drain region. A gate stack is disposed above the substrate, over the channel region. The gate stack includes a first tunnel dielectric layer region and a second tunnel dielectric layer region disposed above the channel region and separated by a distance. The gate stack also includes a first charge-trapping region and a second charge-trapping region, the regions disposed above the first tunnel dielectric layer region and second tunnel dielectric layer region, respectively, and separated by the distance. The gate stack also includes an isolating dielectric layer disposed above the channel region, between the first charge-trapping region and the second charge-trapping region, and between the first tunnel dielectric layer region and the second tunnel dielectric layer region. A gate dielectric layer is disposed above the first charge-trapping region, the second charge-trapping region and the isolating dielectric layer. A gate electrode is disposed above the gate dielectric layer.

In one embodiment, the isolating dielectric layer both physically and electrically isolates the first charge-trapping region from the second charge-trapping region.

In one embodiment, the distance between the first charge-trapping region and the second charge-trapping region is approximately in the range of 3-20 nanometers.

In one embodiment, the isolating dielectric layer is composed of silicon oxide or silicon dioxide.

In one embodiment, the gate dielectric layer is composed of a high-k dielectric material.

In one embodiment, the gate electrode is a metal gate electrode.

In one embodiment, the nonvolatile charge trap memory device is a SONOS-type device.

In one embodiment, the source region, the drain region and the gate electrode are N-type, and the SONOS-type device is an N-type SONOS-type device.

In one embodiment, the first tunnel dielectric layer region further extends along an outer sidewall of the first charge-trapping region, and the second tunnel dielectric layer region further extends along an outer sidewall of the second charge-trapping region.

In an embodiment, a method of fabricating a nonvolatile charge trap memory device includes removing a dummy gate electrode to form a trench above a substrate having a channel region, a source region and a drain region all self-aligned to the trench. The method also includes forming a tunnel dielectric layer in the trench. The method also includes forming a first charge-trapping region and a second charge-trapping region above the tunnel dielectric layer and separated by a distance. The method also includes forming an isolating dielectric layer between the first charge-trapping region and the second charge-trapping region. The method also includes forming a gate dielectric layer above the first charge-trapping region, the second charge-trapping region and the isolating dielectric layer. The method also includes forming a gate electrode disposed above the gate dielectric layer.

In one embodiment, forming the isolating dielectric layer further involves forming the isolating dielectric layer above the tunnel dielectric layer.

In one embodiment, forming the isolating dielectric layer further involves forming the isolating dielectric layer between first and second regions of the tunnel dielectric layer.

In one embodiment, forming the isolating dielectric layer involves both physically and electrically isolating the first charge-trapping region from the second charge-trapping region.

In one embodiment, forming the isolating dielectric layer involves forming a silicon oxide or silicon dioxide layer.

In one embodiment, forming the gate dielectric layer involves forming a high-k dielectric material.

In one embodiment, forming the gate electrode involves forming a metal gate electrode.

What is claimed is:

1. A nonvolatile charge trap memory device, comprising:
    a substrate having a channel region, a source region and a drain region; and
    a gate stack disposed above the substrate, over the channel region, wherein the gate stack comprises:
        a tunnel dielectric layer disposed above the channel region, the tunnel dielectric layer having outermost sidewalls;
        a first charge-trapping region and a second charge-trapping region, the first and second charge-trapping regions disposed above the tunnel dielectric layer and separated by a distance, and the first and second charge-trapping regions having outermost sidewalls in vertical alignment with the outermost sidewalls of the tunnel dielectric layer;
        an isolating dielectric layer disposed above the tunnel dielectric layer and between the first charge-trapping region and the second charge-trapping region;
        a gate dielectric layer disposed above the first charge-trapping region, the second charge-trapping region and the isolating dielectric layer; and
        a gate electrode disposed above the gate dielectric layer.

2. The nonvolatile charge trap memory device of claim 1, wherein the isolating dielectric layer both physically and electrically isolates the first charge-trapping region from the second charge-trapping region.

3. The nonvolatile charge trap memory device of claim 1, wherein the distance between the first charge-trapping region and the second charge-trapping region is approximately in the range of 3-20 nanometers.

4. The nonvolatile charge trap memory device of claim 1, wherein the isolating dielectric layer comprises silicon oxide or silicon dioxide.

5. The nonvolatile charge trap memory device of claim 1, wherein the gate dielectric layer comprises a high-k dielectric material.

6. The nonvolatile charge trap memory device of claim 1, wherein the gate electrode is a metal gate electrode.

7. The nonvolatile charge trap memory device of claim 1, wherein the nonvolatile charge trap memory device is a SONOS-type device.

8. The nonvolatile charge trap memory device of claim 7, wherein the source region, the drain region and the gate electrode are N-type, and the SONOS-type device is an N-type SONOS-type device.

9. A nonvolatile charge trap memory device, comprising:
    a substrate having a channel region, a source region and a drain region; and
    a gate stack disposed above the substrate, over the channel region, wherein the gate stack comprises:
        a first tunnel dielectric layer region and a second tunnel dielectric layer region disposed above the channel region and separated by a distance;
        a first charge-trapping region and a second charge-trapping region, the first and second charge-trapping regions disposed above the first tunnel dielectric layer region and second tunnel dielectric layer region, respectively, and separated by the distance, wherein the first and second charge-trapping regions have outermost sidewalls, and the first tunnel dielectric layer region and second tunnel dielectric layer region are along at least a portion of the outermost sidewalls of the first and second charge-trapping regions, respectively;
        an isolating dielectric layer disposed above the channel region, between the first charge-trapping region and the second charge-trapping region, and between the first tunnel dielectric layer region and the second tunnel dielectric layer region;

a gate dielectric layer disposed above the first charge-trapping region, the second charge-trapping region and the isolating dielectric layer; and a gate electrode disposed above the gate dielectric layer.

10. The nonvolatile charge trap memory device of claim 9, wherein the isolating dielectric layer both physically and electrically isolates the first charge-trapping region from the second charge-trapping region.

11. The nonvolatile charge trap memory device of claim 9, wherein the distance between the first charge-trapping region and the second charge-trapping region is approximately in the range of 3-20 nanometers.

12. The nonvolatile charge trap memory device of claim 9, wherein the isolating dielectric layer comprises silicon oxide or silicon dioxide.

13. The nonvolatile charge trap memory device of claim 9, wherein the gate dielectric layer comprises a high-k dielectric material.

14. The nonvolatile charge trap memory device of claim 9, wherein the gate electrode is a metal gate electrode.

15. The nonvolatile charge trap memory device of claim 9, wherein the nonvolatile charge trap memory device is a SONOS-type device.

16. The nonvolatile charge trap memory device of claim 15, wherein the source region, the drain region and the gate electrode are N-type, and the SONOS-type device is an N-type SONOS-type device.

17. The nonvolatile charge trap memory device of claim 9, wherein the first tunnel dielectric layer region and second tunnel dielectric layer region are along the entire outermost sidewalls of the first and second charge-trapping regions, respectively.

18. A nonvolatile charge trap memory device, comprising:
a substrate having a channel region, a source region and a drain region; and
a gate stack disposed above the substrate, over the channel region, wherein the gate stack comprises:
a first tunnel dielectric layer region and a second tunnel dielectric layer region disposed above the channel region and separated by a distance;
a first charge-trapping region and a second charge-trapping region, the regions disposed above the first tunnel dielectric layer region and second tunnel dielectric layer region, respectively, and separated by the distance, wherein the first tunnel dielectric layer region further extends along an outer sidewall of the first charge-trapping region, and the second tunnel dielectric layer region further extends along an outer sidewall of the second charge-trapping region;
an isolating dielectric layer disposed above the channel region, between the first charge-trapping region and the second charge-trapping region, and between the first tunnel dielectric layer region and the second tunnel dielectric layer region;
a gate dielectric layer disposed above the first charge-trapping region, the second charge-trapping region and the isolating dielectric layer; and
a gate electrode disposed above the gate dielectric layer.

19. The nonvolatile charge trap memory device of claim 18, wherein the isolating dielectric layer both physically and electrically isolates the first charge-trapping region from the second charge-trapping region.

20. The nonvolatile charge trap memory device of claim 18, wherein the distance between the first charge-trapping region and the second charge-trapping region is approximately in the range of 3-20 nanometers.

* * * * *